(12) United States Patent
Yoon

(10) Patent No.: US 11,690,249 B2
(45) Date of Patent: Jun. 27, 2023

(54) LIGHT EXTRACTION SUBSTRATE OF ORGANIC LIGHT-EMITTING DEVICE AND METHOD OF FABRICATING THE SAME

(71) Applicant: CORNING INCORPORATED, Corning, NY (US)

(72) Inventor: Hong Yoon, Asan-si (KR)

(73) Assignee: Corning Incorporated, Corning, NY (US)

( * ) Notice: Subject to any disclaimer, the term of this patent is extended or adjusted under 35 U.S.C. 154(b) by 58 days.

(21) Appl. No.: 17/056,922

(22) PCT Filed: May 24, 2019

(86) PCT No.: PCT/US2019/033901
§ 371 (c)(1),
(2) Date: Nov. 19, 2020

(87) PCT Pub. No.: WO2019/231841
PCT Pub. Date: Dec. 5, 2019

(65) Prior Publication Data
US 2021/0210732 A1 Jul. 8, 2021

(30) Foreign Application Priority Data
May 28, 2018 (KR) .......................... 10-2018-0060322

(51) Int. Cl.
*H01L 51/52* (2006.01)
*H10K 50/854* (2023.01)
*H10K 71/00* (2023.01)

(52) U.S. Cl.
CPC ........... *H10K 50/854* (2023.02); *H10K 71/00* (2023.02)

(58) Field of Classification Search
CPC ............. H01L 51/0024; H01L 51/5268; H01L 51/5269; H01L 51/56
See application file for complete search history.

(56) References Cited

U.S. PATENT DOCUMENTS 9,793,516 B2  10/2017  Kwon et al.
9,893,320 B2   2/2018  Youn et al.
(Continued)

FOREIGN PATENT DOCUMENTS

CN        104466008 A     3/2015
KR   10-2011-0062236 A    6/2011
(Continued)

OTHER PUBLICATIONS

Jooyoung Lee et al., "Enhancement of light-extraction efficiency of organic light-emitting diodes using silica nanoparticles embedded in TiO2 matrices", Opt. Express 22, vol. 22, No. S3 ,A705 2014, pp. 10.
Sohee Jeon et al., "Vaccum nano-hole array embedded organic light emitting diodes", Nanoscale 6, Scientific Reports, 2642, Mar. 3, 2015, pp. 1-7.
Wolfgang Brutting et al., "Device efficiency of organic light-emitting diodes: Progress by improved light outcoupling", Phys. Status Solidi A 210, No. 1, pp. 44-65 (2013).
(Continued)

*Primary Examiner* — Caridad Everhart

(57) ABSTRACT

Various aspects of a light extraction substrate, an organic light emitting device, and methods of fabrication are provided. A light extraction substrate of an organic light-emitting device includes a light-scattering layer disposed on a base substrate and contains a first material, and a number of holes (hole diameters ranging from 350 nm to 450 nm) extending between the first surface and the second surface. A planarization layer (thickness not greater than 200 nm) is disposed on the light-scattering layer and contains a second material.

12 Claims, 7 Drawing Sheets

(56) References Cited

U.S. PATENT DOCUMENTS

| | | | |
|---|---|---|---|
| 2003/0186514 A1* | 10/2003 | Imada | B81B 1/00 |
| | | | 438/785 |
| 2010/0150513 A1 | 6/2010 | Zhang et al. | |
| 2013/0286659 A1 | 10/2013 | Lee et al. | |
| 2014/0241509 A1* | 8/2014 | Kitamura | G21K 1/062 |
| | | | 428/307.3 |
| 2015/0044417 A1* | 2/2015 | Koike | B29C 33/3857 |
| | | | 264/447 |
| 2015/0097166 A1 | 4/2015 | Setz et al. | |
| 2015/0144900 A1* | 5/2015 | Lee | C03C 17/007 |
| | | | 257/40 |
| 2016/0164038 A1 | 6/2016 | Cho et al. | |
| 2016/0172632 A1 | 6/2016 | Kwon et al. | |
| 2016/0301022 A1 | 10/2016 | Yoon et al. | |
| 2016/0303838 A1* | 10/2016 | Chen | B32B 27/06 |
| 2016/0308075 A1* | 10/2016 | Wang | H01L 27/1446 |
| 2017/0358776 A1 | 12/2017 | Kim et al. | |
| 2019/0025481 A1* | 1/2019 | Du | G02B 5/26 |

FOREIGN PATENT DOCUMENTS

| | | |
|---|---|---|
| KR | 10-2014-0133278 A | 11/2014 |
| KR | 10-1466831 B1 | 11/2014 |
| KR | 10-2016-0080087 A | 7/2016 |

OTHER PUBLICATIONS

Yu Luo et al., "Enhanced light extraction and tunable chromaticity in white organic light-emitting devices with ZnO nanopillars", Optics Letters, Jan. 2016, vol. 41, No. 5, pp. 1217-1220.

International Search Report and Written Opinion of the International Searching Authority; PCT/US2019/033901; dated Jul. 29, 2019; 13 Pages; European Patent Office.

Korean Patent Application No. 10-2018-0060322, Office Action, dated Oct. 14, 2022, 20 pages (12 pages of English Translation and 8 pages of Original Copy); Korean Patent Office.

* cited by examiner

LIGHT EXTRACTION SUBSTRATE OF ORGANIC LIGHT-EMITTING DEVICE AND METHOD OF FABRICATING THE SAME

BACKGROUND

Field

This application claims the benefit of priority under 35 U.S.C. § 371 of International Application No. PCT/US2019/033901, filed on May 24, 2019, which claims the benefit of priority of Korean Application Serial No. 10-2018-0060322 filed on May 28, 2018 the contents of each of which are relied upon and incorporated herein by reference in their entirety as if fully set forth below.

Description of Related Art

Light generated by an organic light-emitting device including an organic light-emitting diode (OLED) may be trapped in such an organic light-emitting device due to a number of reasons, thereby limiting the luminous efficiency of the organic light-emitting device in a range of 20% to 30%. The refractive index of an organic layer and/or a transparent electrode is 1.8 to 1.9, higher than the refractive index of a surrounding glass base substrate or air. Thus, a portion of light may be trapped in the organic layer. In addition, "plasmon waveguiding" occurring in a metal electrode may cause light loss. Furthermore, total internal reflection may cause light to be trapped in the glass base substrate, which is referred to as "substrate mode." As one method for improving light extraction efficiency by overcoming light waveguiding, a light extraction layer that can scatter light is introduced between the transparent electrode and the glass base substrate. In general, the light extraction layer located between the transparent substrate and the OLED is referred to as an internal light extraction layer.

A light extraction layer of the related art is a film in which light-scattering elements, such as holes or particles, having sizes of tens of nanometers to several micrometers, are distributed in a three-dimensional (3D) arrangement. A precise design may be necessary for the light extraction layer of the related art, and several complicated steps must be undertaken for fabrication. The light extraction layer of the related art may have significantly low light scattering efficiency, since the light-scattering elements may be distributed in a 3D arrangement, or, even if the light-scattering elements are distributed as a monolayer, the heights thereof may be non-uniform. Considering the structure of the light extraction layer of the related art and the refractive index of the film, it may be difficult to significantly improve light extraction efficiency.

SUMMARY

According to an aspect of the present disclosure, a light extraction substrate of an organic light-emitting device may include: a base substrate; a light-scattering layer disposed on the base substrate, and including a first material, the light-scattering layer including a first surface facing the base substrate, and a second surface opposite the first surface, a number of holes formed in the light-scattering layer, each of the number of holes extending between the first surface and the second surface; and a planarization layer disposed on the light-scattering layer, and including a second material. Refractive indices of the first material and the second material may range from 1.8 to 2.6. Diameters of the number of holes may range from 350 nm to 450 nm when measured on a plane perpendicular to a thickness direction of the light-scattering layer. A ratio of an area that the number of holes occupy in the first surface to an area of the first surface may be at least 40%. A thickness of the planarization layer may be 200 nm or less.

According to another aspect of the present disclosure, an organic light-emitting device may include: a base substrate; a light-scattering layer disposed on the base substrate, and including a first material, the light-scattering layer including a first surface facing the base substrate, and a second surface opposite the first surface, a number of holes formed in the light-scattering layer, each of the number of holes extending between the first surface and the second surface; a planarization layer disposed on the light-scattering layer, and including a second material; an anode electrode layer disposed on the planarization layer; an organic layer disposed on the anode electrode layer; and a cathode electrode layer disposed on the organic layer. Refractive indices of the first material and the second material may range from 1.8 to 2.6. Diameters of the number of holes may range from 350 nm to 450 nm when measured on a plane perpendicular to a thickness direction of the light-scattering layer. A ratio of an area that the number of holes occupy in the first surface to an area of the first surface may be at least 40%. A thickness of the planarization layer may be 200 nm or less.

According to another aspect of the present disclosure, a method of fabricating a light extraction substrate of an organic light-emitting device may include: forming a light-scattering layer on a base substrate such that a number of holes are formed in the light-scattering layer, the light-scattering layer including a first material, and including a first surface facing the base substrate, and a second surface opposite the first surface, each of the number of holes extending between the first surface and the second surface; forming a planarization layer on a support, the planarization layer including a second material; bonding the planarization layer to the light-scattering layer; and removing the support from the planarization layer.

According to another aspect of the present disclosure, a method of fabricating a light extraction substrate of an organic light-emitting device, the method may include: forming a planarization layer on a support, the planarization layer including a second material; forming a light-scattering layer on the planarization layer such that a number of holes are formed in the light-scattering layer, the light-scattering layer including a first material, the light-scattering layer including a first surface facing the planarization layer, and a second surface opposite the first surface, each of the number of holes extending between the first surface and the second surface; bonding a base substrate to the light-scattering layer; and removing the support from the planarization layer.

The present disclosure can significantly improve the performance of an organic light-emitting device by optimizing the distribution of light-scattering elements (holes), the refractive index and the thickness of a light extraction layer, and the like.

The present disclosure can provide an ultra-thin high-efficiency light extraction layer in which light-scattering holes are embedded.

The methods and apparatuses of the present disclosure have other features and advantages that will be apparent from or that are set forth in greater detail in the accompanying drawings, the disclosures of which are incorporated herein, and in the following Detailed Description, which together serve to explain certain principles of the present disclosure.

DETAILED DESCRIPTION

Hereinafter, reference will be made to the present disclosure in detail, embodiments of which are illustrated in the accompanying drawings and described below, so that a person having ordinary skill in the art to which the present disclosure relates could easily put the present disclosure into practice.

Figure 1:
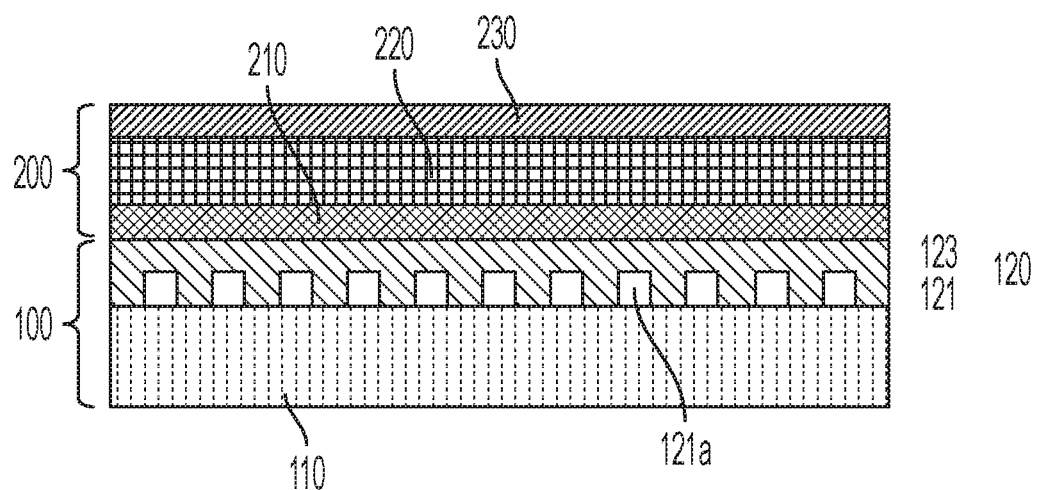
FIG. 1 is a cross-sectional view schematically illustrating a structure of an organic light-emitting device according to exemplary embodiments.
Figure 2:
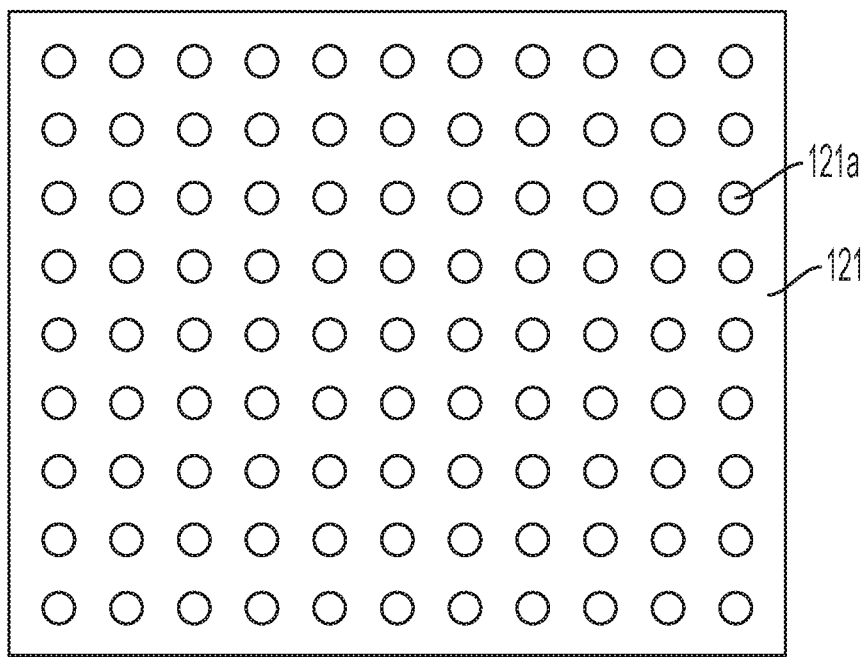
FIG. 2 illustrates a first surface of a light-scattering layer of the organic light-emitting device illustrated in FIG. 1.

FIG. 1 is a cross-sectional view schematically illustrating a structure of an organic light-emitting device according to exemplary embodiments, and FIG. 2 illustrates a first surface of a light-scattering layer 121 of the organic light-emitting device illustrated in FIG. 1.

The present disclosure relates to an improvement in the luminous efficiency of the organic light-emitting device. The organic light-emitting device may be used for a display device, a lighting device, and the like.

The organic light-emitting device according to some embodiments may include a light extraction substrate 100 and an organic light-emitting diode (OLED) 200.

In the OLED 200, an organic layer 220 including a light-emitting layer may be located between an anode electrode layer 210 and a cathode electrode layer 230. According to some embodiments, the organic layer 220 may have a thickness of several hundreds of nanometers. According to some embodiments, the anode electrode layer 210 may contain a transparent conductive oxide, such as indium tin oxide (ITO). The cathode electrode layer 230 may contain a metal, such as aluminum (Al) or silver (Ag). When current is applied through the two electrode layers, electrons and holes are recombined in the light-emitting layer of the organic layer 220, thereby emitting light.

Figure 3:
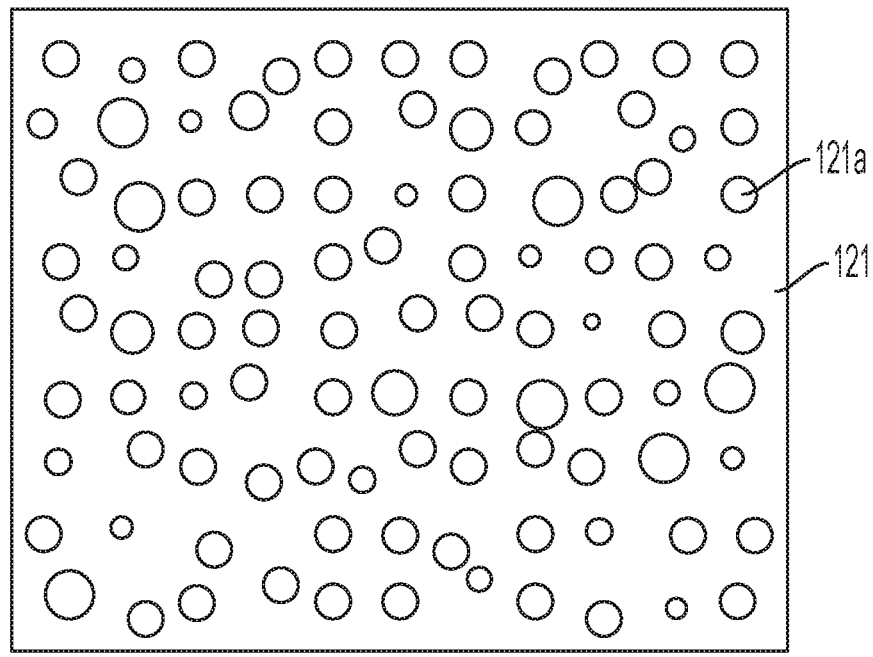
FIG. 3 illustrates a first surface of the light-scattering layer of the organic light-emitting device according to exemplary embodiments.
Figure 9:
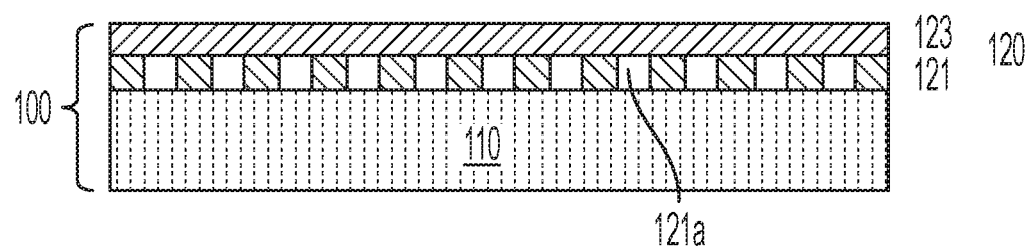
FIG. 9 is a cross-sectional view schematically illustrating a structure of the light extraction substrate of the organic light-emitting device according to exemplary embodiments.

The light extraction substrate 100 may include a base substrate 110 and a light extraction layer 120 fabricated on the base substrate 110. The light extraction layer 120 may include a light-scattering layer 121 fabricated on the base substrate 110 and a planarization layer 123 fabricated on the light-scattering layer 121. According to some of such embodiments, the thickness of the light extraction layer 120, i.e. a total of the thickness of the light-scattering layer 121 and the thickness of the planarization layer 123, may be up to 1 μm. According to some embodiments, the base substrate 110 may be a glass substrate or a polymer substrate (formed from polyimide (PI), poly(methyl methacrylate) (PMMA), polyethylene terephthalate (PET), or the like). The light-scattering layer 121 may contain a first material. The light-scattering layer 121 may include a first surface facing the base substrate 110 and a second surface opposite the first surface. The light-scattering layer 121 may be configured such that a plurality of holes 121a are arranged between the first surface and the second surface. Accordingly, a monolayer of the plurality of holes 121a may be provided in the light-scattering layer 121. The heights of the plurality of holes 121a may be substantially the same according to some embodiments, although the heights of the plurality of holes 121a may be different according to some other embodiments. (That is, the second surface may not be a flat surface.) The plurality of holes 121a according to some embodiments may have a cylindrical shape, as illustrated in FIG. 2, although the plurality of holes 121a according to some alternative embodiments may have a non-cylindrical shape, such as a spherical shape or an elliptical cross-sectional shape. The elliptical cross-section may be parallel or perpendicular to the first surface or be disposed at a predetermined angle with respect to the first surface. In addition, the plurality of holes 121a according to some embodiments may have substantially the same shape, although the plurality of holes 121a according to some other embodiments may have different shapes. For example, some holes 121a may have a cylindrical shape, while the other holes 121a may have a non-cylindrical shape. According to some embodiments, the plurality of holes 121a may define a dot pattern on the first surface. The dots in the dot pattern according to some embodiments may be periodically arranged, as illustrated in FIG. 2, although the dots in the dot pattern according to some other embodiments may be randomly arranged, as illustrated in FIG. 3. The planarization layer 123 may contain a second material. According to some embodiments, the first material and the second material may be the same material, as illustrated in FIG. 1. In contrast, according to some alternative embodiments, the first material and the second material may be different materials, as illustrated in FIG. 9. According to some embodiments, the refractive indices of the first material and the second material may range from 1.8 to 2.6. According to some embodiments, each of the first material and the second material may contain at least one selected from among i) Sift, ii) AlON, iii) SiON, iv) $TiO_2$, v) $Al_2O_3$, vi) ZnO, viii) $ZrO_2$, and ix) a composite of at least one of Sift, AlON, SiON, $TiO_2$, $Al_2O_3$, ZnO, and $ZrO_2$ and polymer (i.e. an oxide-polymer hybrid material).

Light emitted by the organic layer 220 exits through the anode electrode layer 210 and the light extraction substrate 100. The organic light-emitting device having the above-described configuration is referred to as a bottom-emitting organic light-emitting device, but the present disclosure is not limited to the bottom-emitting organic light-emitting device.

Figure 4:
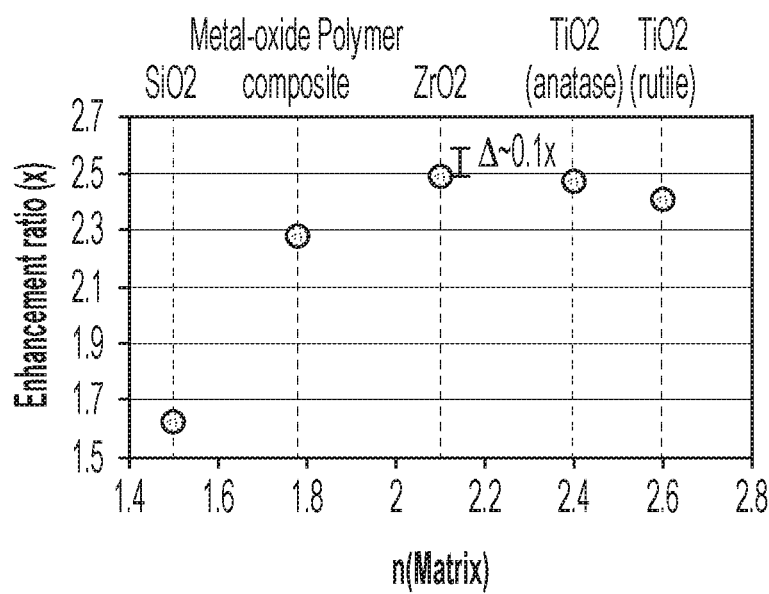
FIG. 4 is a graph illustrating the relationship between the refractive index of the light extraction layer and the light extraction efficiency in the organic light-emitting device illustrated in FIG. 1.

FIG. 4 is a graph illustrating the relationship between the refractive index of the light extraction layer 120 and the light extraction efficiency in the organic light-emitting device illustrated in FIG. 1.

In the light extraction layer 120 in which the light-scattering layer 121 and the planarization layer 123 are formed from the same material, the light extraction efficiency can be significantly improved by fabricating the light extraction layer 120 from a material having a refractive index of 2.0 to 2.6.

To verify this feature, an optical simulation was performed on the organic light-emitting device illustrated in FIG. 1, and the result was obtained, as illustrated in the graph of FIG. 4. The holes 121a were formed using nano-imprint technology. A wave optical numerical analysis based on the finite difference time domain (FDTD) method was used for calculation. In this simulation, a maximum efficiency of 2.5 times was obtained at a refractive index of about 2.1, evaluated as an optimum refractive index. The efficiency obtained at a refractive index of 2.0 to 2.6 was at least 2.3 times. In this simulation, the refractive index 2.1 is the optimum refractive index. Since the refractive indices of the anode electrode layer 210 and the organic layer 220 are on the order of 1.8 to 1.9, refractive index matching between the light extraction layer 120 and these layers reduces light loss caused by waveguiding mode.

Figure 5:
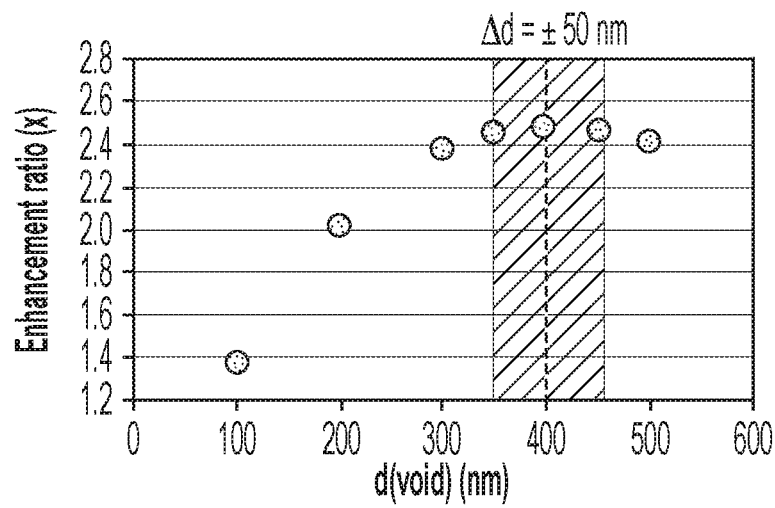
FIG. 5 is a graph illustrating the relationship between the diameter of the holes and the light extraction efficiency in the organic light-emitting device illustrated in FIG. 1.
Figure 6:
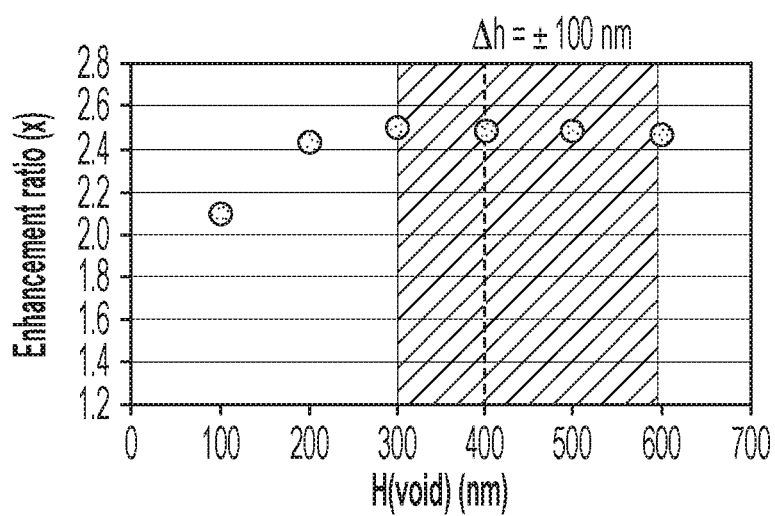
FIG. 6 is a graph illustrating the relationship between the length of the holes in the thickness direction of the light extraction layer and the light extraction efficiency in the organic light-emitting device illustrated in FIG. 1.

FIG. 5 is a graph illustrating the relationship between the diameter of the holes 121a and the light extraction efficiency in the organic light-emitting device illustrated in FIG. 1, and FIG. 6 is a graph illustrating the relationship between the length of the holes 121a in the thickness direction of the light extraction layer and the light extraction efficiency in the organic light-emitting device illustrated in FIG. 1.

In the light extraction layer 120 illustrated in FIG. 1, it is possible to significantly improve the light extraction efficiency by fabricating the holes 121a such that the diameters thereof, when measured on a plane perpendicular to the thickness direction of the light-scattering layer 121, are 400±50 nm. In addition, it is possible to significantly improve the light extraction efficiency by fabricating the holes 121a such that the lengths thereof, when measured in the thickness direction of the light-scattering layer 121, are 400±100 nm.

Simulations were performed to verify these features, and the result graphs as illustrated in FIGS. 5 and 6 were obtained. In these simulations, both the diameter and the length were 400 nm when optimum efficiencies were obtained. It is apparent that the light extraction efficiency is more sensitively influenced by the diameter of the holes 121a than the length of the holes 121a.

Figure 7:
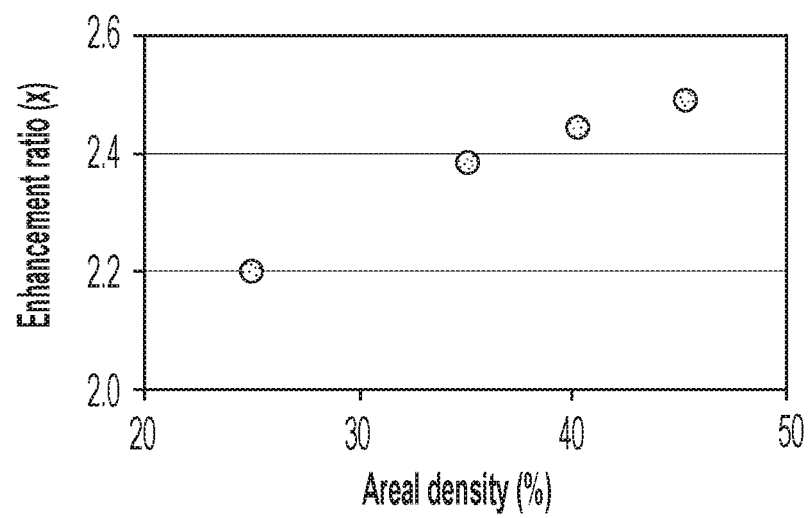
FIG. 7 is a graph illustrating the relationship between the areal density of the holes and the light extraction efficiency in the organic light-emitting device illustrated in FIG. 1.

FIG. 7 is a graph illustrating the relationship between the areal density of the holes 121a and the light extraction efficiency in the organic light-emitting device illustrated in FIG. 1.

With increases in the areal density of the holes 121a in the area of the first surface, light scattering probability is increased, thereby increasing the light extraction efficiency. The optimum areal density is at least 40%.

Figure 8:
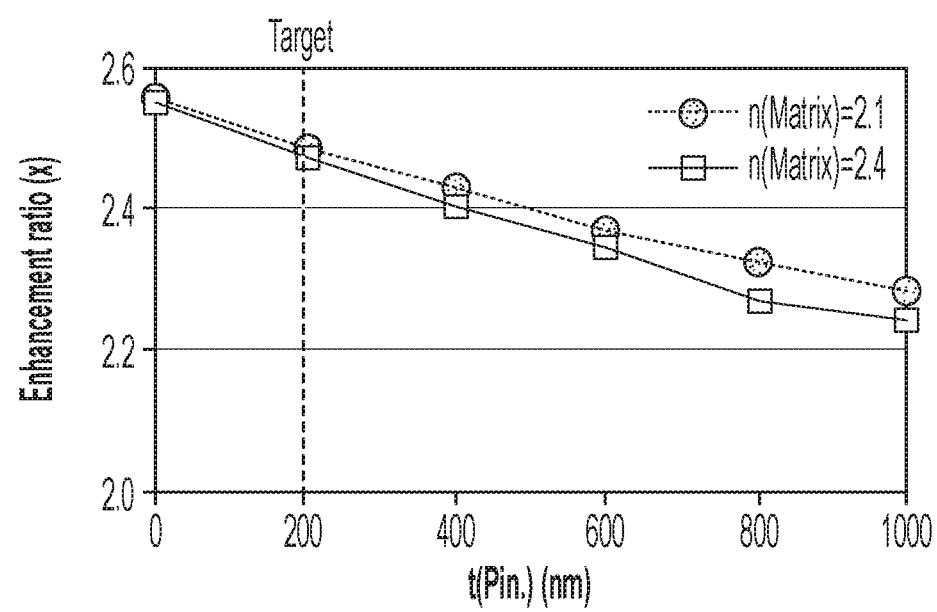
FIG. 8 is a graph illustrating the relationship between the thickness of the planarization layer and the light extraction efficiency in the organic light-emitting device illustrated in FIG. 1.

FIG. 8 is a graph illustrating the relationship between the thickness of the planarization layer 123 and the light extraction efficiency in the organic light-emitting device illustrated in FIG. 1.

The lower the thickness of the planarization layer 123 is, the greater the scattering probability of light waveguiding mode is, thereby improving the light extraction efficiency. Excellent light extraction efficiency can be obtained from the planarization layer 123 having a maximum thickness of 200 nm. The 200 nm thickness of the planarization layer 123 can be sufficiently realized by the nano-imprint technology. Although the refractive index of the light extraction layer 120 is changed, the same trend is observed. It is apparent that the physical distance between the holes 121a acting as light-scattering elements and the OLED 200 has a significant effect on the light extraction efficiency.

FIG. 9 is a cross-sectional view schematically illustrating a structure of the light extraction substrate 100 of the organic light-emitting device according to exemplary embodiments.

According to some embodiments, as illustrated in FIG. 9, the light-scattering layer 121 and the planarization layer 123 may be formed from different materials.

Figure 10:
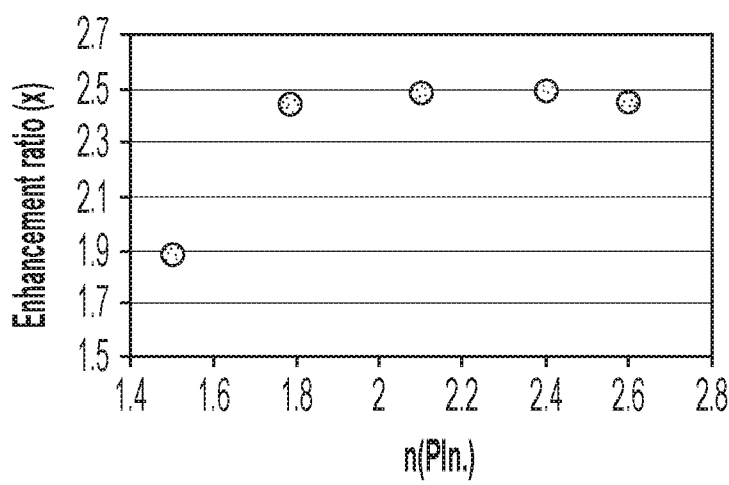
FIG. 10 is a graph illustrating the relationship between the refractive index of the planarization layer and the light extraction efficiency in the organic light-emitting device illustrated in FIG. 9.

FIG. 10 is a graph illustrating the relationship between the refractive index of the planarization layer 123 and the light extraction efficiency in the organic light-emitting device illustrated in FIG. 9.

FIG. 10 illustrates a modeling result of variations in the light extraction efficiency obtained by fixing the refractive index of the first material to 2.1 and changing the refractive index of the second material. According to the result of simulation, when the refractive index of the second material is 1.8 or more, there is no significant variation in the efficiency. It is apparent, however, that the light extraction efficiency is sharply lowered when the refractive index of the planarization layer 123 is lowered to a level of about 1.5, which is similar to the refractive index of the base substrate 110 formed from glass, even in the case in which the planarization layer 123 has a low thickness of 200 nm. This is because light is waveguided in the organic layer 220, since the refractive index matching between the planarization layer 123 and the OLED 200 is not satisfied.

Figure 11:
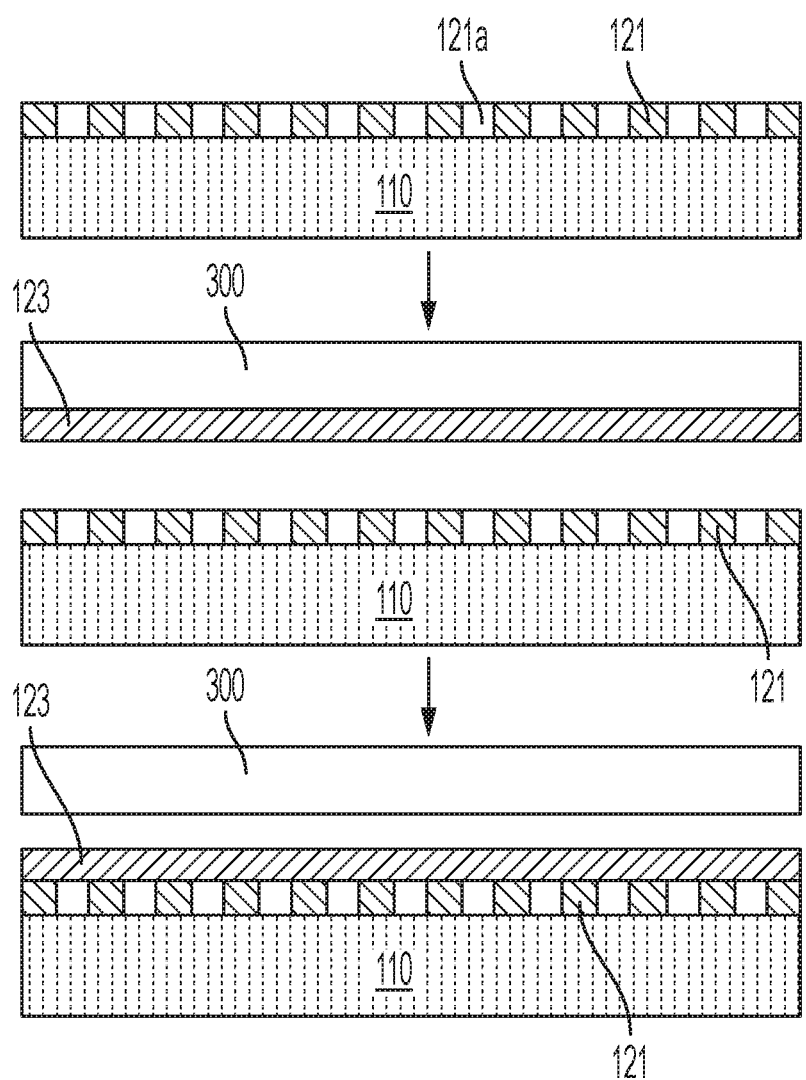
FIG. 11 schematically illustrates a method of fabricating the light extraction substrate of the organic light-emitting device according to exemplary embodiments.

FIG. 11 schematically illustrates a method of fabricating the light extraction substrate 100 of the organic light-emitting device according to exemplary embodiments.

The light extraction layer 120 according to exemplary embodiments can be subjected to a nano-patterning process, thereby providing superior reliability.

In a method of fabricating the light extraction substrate 100 according to some embodiments, a first material layer is formed on a base substrate 110, and then a light-scattering layer 121 is fabricated by nano-imprinting a plurality of holes 121a, as illustrated in FIG. 11. In addition, a planarization layer 123 formed from a second material is fabricated on a support 300. Subsequently, the planarization layer 123 is bonded to the light-scattering layer 121. For example, according to some embodiments, the planarization layer 123 may be chemically bonded to the light-scattering layer 121 by heating. Afterwards, the support 300 is removed from the planarization layer 123.

Figure 12:
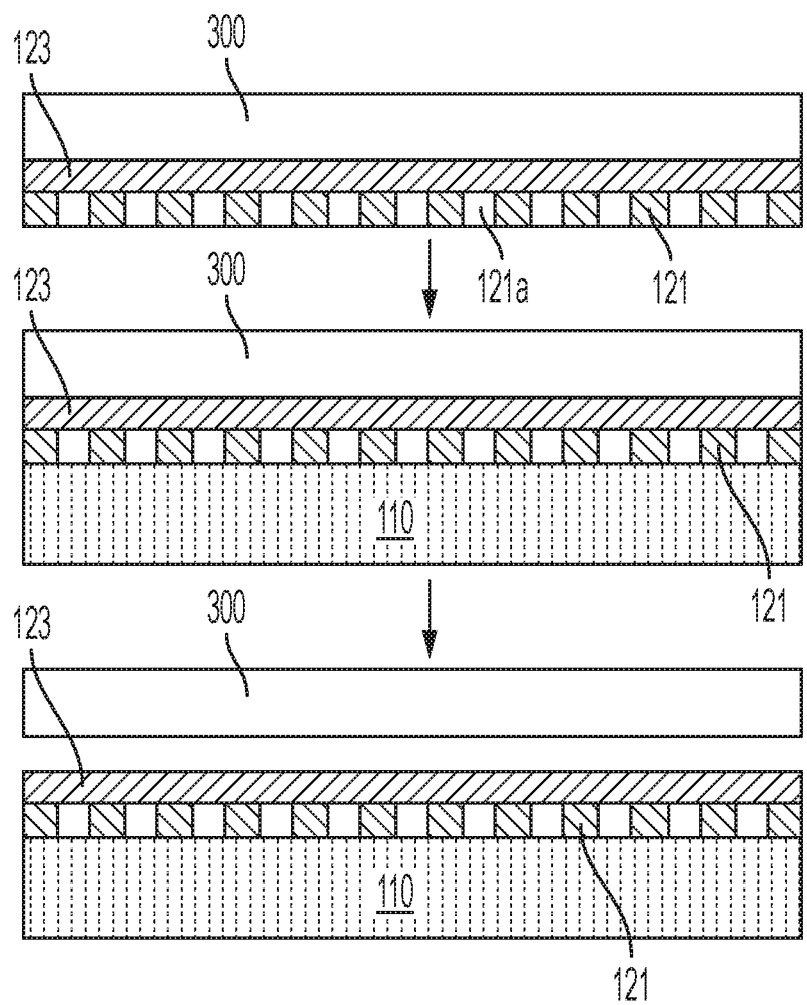
FIG. 12 schematically illustrates a method of fabricating the light extraction substrate of the organic light-emitting device according to exemplary embodiments.

FIG. 12 schematically illustrates a method of fabricating the light extraction substrate 100 of the organic light-emitting device according to exemplary embodiments.

In the method of fabricating the light extraction substrate according to some embodiments, first, a planarization layer 123 formed from the second material is fabricated on a support 300. Afterwards, a first material layer is formed on the planarization layer 123, and then a plurality of holes 121a are nano-imprinted. Subsequently, a base substrate 110 is bonded to a light-scattering layer 121. For example, according to some embodiments, the base substrate 110 may be chemically bonded to the light-scattering layer 121 by heating. Afterwards, the support 300 is removed from the planarization layer 123.

When the first material and the second material are the same material, the light extraction layer 120 may be fabricated by forming a layer from the first material (second material) on the support 300 and then nano-imprinting the holes 121a to a depth corresponding to a partial thickness of the first material layer.

The foregoing descriptions of specific exemplary embodiments of the present disclosure have been presented with respect to the drawings and are not intended to be exhaustive or to limit the present disclosure to the precise forms disclosed herein, and many modifications and variations would obviously be possible for a person having ordinary skill in the art in light of the above teachings.

It is intended, therefore, that the scope of the present disclosure not be limited to the foregoing embodiments, but be defined by the Claims appended hereto and their equivalents.

What is claimed is:

1. A light extraction substrate of an organic light-emitting device, comprising:
   abase substrate;
   a light-scattering layer disposed on the base substrate, and comprising a first material, the light-scattering layer comprising a first surface facing the base substrate, and a second surface opposite the first surface, a number of holes formed in the light-scattering layer, each of the number of holes extending between the first surface and the second surface; and
   a planarization layer disposed on the light-scattering layer, and comprising a second material,
   wherein refractive indices of the first material and the second material range from 1.8 to 2.6,
   wherein each of the number of holes comprises a diameter and the diameters of the number of holes range from 350 nm to 450 nm when measured on a plane perpendicular to a thickness direction of the light-scattering layer,
   a ratio of an area that the number of holes occupy in the first surface to an area of the first surface is at least 40%, and
   a thickness of the planarization layer is 200 nm or less.

2. The light extraction substrate of claim 1, wherein each of the number of holes comprises a length and the lengths of the number of holes in the thickness direction of the light-scattering layer range from 300 nm to 500 nm.

3. The light extraction substrate of claim 1, wherein a total of a thickness of the light-scattering layer and the thickness of the planarization layer is 1 μm or less.

4. The light extraction substrate of claim 1, wherein the number of holes have a shape selected from the group consisting of a cylindrical shape, a spherical shape, and a shape having an elliptical cross-section.

5. The light extraction substrate of claim 1, wherein the first material and the second material are the same material or different materials.

6. The light extraction substrate of claim 5, wherein the first material and the second material are the same material, and the refractive indices of the first material and the second material range from 2.0 to 2.6.

7. The light extraction substrate of claim 5, wherein the first material and the second material are different materials, and the refractive index of the second material is at least 1.8.

8. The light extraction substrate of claim 1, wherein the number of holes define a dot pattern in the first surface.

9. The light extraction substrate of claim 1, wherein the base substrate comprises a glass substrate or a polymer substrate.

10. The light extraction substrate of claim 1, wherein the first material and the second material comprise at least one selected from the group consisting of $SiO_2$, AlON, SiON, $TiO_2$, $Al_2O_3$, ZnO, $ZrO_2$, and a composite material of polymer and at least one of $SiO_2$, AlON, SiON, $TiO_2$, $Al_2O_3$, ZnO, and $ZrO_2$.

11. An organic light-emitting device comprising:
    abase substrate;
    a light-scattering layer disposed on the base substrate, and comprising a first material, the light-scattering layer comprising a first surface facing the base substrate, and a second surface opposite the first surface, a number of holes formed in the light-scattering layer, each of the number of holes extending between the first surface and the second surface;
    a planarization layer disposed on the light-scattering layer, and comprising a second material;
    an anode electrode layer disposed on the planarization layer;
    an organic layer disposed on the anode electrode layer; and
    a cathode electrode layer disposed on the organic layer,
    wherein refractive indices of the first material and the second material range from 1.8 to 2.6,
    wherein each of the number of holes comprises a diameter and the diameters of the number of holes range from 350 nm to 450 nm when measured on a plane perpendicular to a thickness direction of the light-scattering layer;
    a ratio of an area that the number of holes occupy in the first surface to an area of the first surface is at least 40%, and
    a thickness of the planarization layer is 200 nm or less.

12. The method of claim 11, wherein
    refractive indices of the first material and the second material range from 1.8 to 2.6,
    each of the number of holes comprises a diameter and the diameters of the number of holes range from 350 nm to 450 nm when measured on a plane perpendicular to a thickness direction of the light-scattering layer,
    a ratio of an area that the number of holes occupy in the first surface to an area of the first surface is at least 40%, and
    a thickness of the planarization layer is 200 nm or less.

* * * * *